United States Patent
Huang (10) Patent No.: US 12,143,117 B2
(45) Date of Patent: Nov. 12, 2024

(54) TIME INTERLEAVED ANALOG TO DIGITAL CONVERTER

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 188 days.

(21) Appl. No.: 17/870,983

(22) Filed: Jul. 22, 2022

(65) Prior Publication Data

US 2023/0143824 A1 May 11, 2023

(30) Foreign Application Priority Data

Nov. 10, 2021 (TW) .................................. 110141884

(51) Int. Cl.
*H03M 1/12* (2006.01)
*H03M 1/38* (2006.01)

(52) U.S. Cl.
CPC ....... *H03M 1/1215* (2013.01); *H03M 1/1245* (2013.01); *H03M 1/38* (2013.01)

(58) Field of Classification Search
CPC .......................... H03M 1/1245; H03M 1/1215
USPC .................................. 341/156, 143, 144, 155
See application file for complete search history.

(56) References Cited

U.S. PATENT DOCUMENTS 5,990,815 A * 11/1999 Linder ................. H03M 1/0641
341/131
10,763,875 B2 9/2020 Huang
10,778,242 B2 9/2020 Huang
10,790,843 B2 9/2020 Huang
11,239,853 B1 * 2/2022 Dai ....................... H03M 1/804
(Continued)

OTHER PUBLICATIONS

OA letter of a counterpart TW application (appl. No. 110141884) mailed on Jun. 6, 2022. Summary of the TW OA letter. 1. Claims 1-5 are rejected as allegedly being unpatentable over cited reference 1 (US 2021/0250040 A1).2. Claims 6-10 are allowable. Correspondence between claims of TW counterpart application and claims of US application: 1. Claims 1-7 and 8-10 in TW counterpart application correspond to claims 1-7 and 9-11 in US application, respectively.

*Primary Examiner* — Peguy Jean Pierre
(74) *Attorney, Agent, or Firm* — WPAT, P.C (57) ABSTRACT

A time-interleaved analog to digital converter includes coarse converter circuitries, a control logic circuit, first and second transfer circuits, a fine converter circuitry, and an encoder circuit. The coarse converter circuitries sequentially sample an input signal and perform coarse conversions to generate decision signals. The control logic circuit generates coarse digital codes according to the decision signals. The first and second transfer circuits respectively transfer first and second residue signals. The fine converter circuitry performs a fine conversion according to a corresponding first residue signal and a corresponding second residue signal to generate a fine digital code. A sampling interval for sampling the input signal and a coarse conversion interval for performing the coarse conversion are determined based on a fine conversion interval for performing the fine conversion. The encoder circuit generates a digital output according to a corresponding coarse digital code and the fine digital code.

20 Claims, 6 Drawing Sheets

(56) References Cited

U.S. PATENT DOCUMENTS

2013/0201043 A1* 8/2013 Wong .................... H03M 1/125
  341/122
2021/0250040 A1 8/2021 Jang

* cited by examiner

TIME INTERLEAVED ANALOG TO DIGITAL CONVERTER

BACKGROUND OF THE INVENTION

1. Field of the Invention

The present disclosure relates to a time-interleaved analog to digital converter, especially to a time-interleaved analog to digital converter having a noise shaping function and multiple operational timings.

2. Description of Related Art

Analog to digital converter is commonly used in various electronic devices to convert analog signals into corresponding digital signals for subsequent signal processing. With increasing operational speed, the available operating interval for the analog to digital converter to convert the signal becomes shorter and shorter. As a result, partial circuits in the analog-to-digital converter (e.g. sampling circuit, comparator circuit, etc.) will require higher specification requirements (e.g. switching speed, power consumption, etc.), which makes the implementation of circuits in an analog to digital converter suitable for high-speed applications more difficult.

SUMMARY OF THE INVENTION

In some aspects, an object of some embodiments of the present disclosure is to provide a time-interleaved analog to digital converter having multiple operational timings suitable for high-speed applications and a high signal-to-noise ratio.

In some aspects of the present disclosure, a time-interleaved analog to digital converter includes a plurality of coarse converter circuitries, a control logic circuit, a plurality of first transfer circuits, a fine converter circuitry, a plurality of second transfer circuits, and an encoder circuit. The plurality of coarse converter circuitries are configured to sequentially sample an input signal and perform a plurality of coarse analog to digital conversions, in order to generate a plurality of decision signals. The control logic circuit is configured to generate a plurality of coarse digital code respectively corresponding to the plurality of coarse analog to digital conversions according to the plurality of decision signals. The plurality of first transfer circuits are configured to sequentially transfer a plurality of first residue signals from the plurality of coarse converter circuitries according to a plurality of first control signals, in which the plurality of first residue signals are generated by the plurality of coarse converter circuitries sequentially performing the plurality of coarse analog to digital conversions. The fine converter circuitry us configured to perform a fine analog to digital conversion according to a first signal in the plurality of first residue signal and a second signal in a plurality of second residue signals to generate a fine digital code, in which a sampling interval of each of the plurality of coarse converter circuitries sampling the input signal and a coarse conversion interval of each of the plurality of coarse converter circuitries performing each of the plurality of coarse analog to digital conversions are set based on a fine conversion interval of the fine converter circuitry performing the fine analog to digital conversion. The plurality of second transfer circuits are configured to sequentially transfer the plurality of second residue signals to the fine converter circuitry according to a plurality of second control signals, in which the plurality of second residue signals are generated by the plurality of coarse converter circuitries in response to the fine analog to digital conversion. The encoder circuit is configured to generate a digital output according to a corresponding one of the plurality of coarse digital codes and the fine digital code.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits, and the term "circuit" may indicate an object, which is formed with one or more transistors and/or one or more active/passive elements based on a specific arrangement, for processing signals.

As used herein, "about", "approximate to", or "equal to" shall generally mean within 20 percent, preferably within 10 percent, and more preferably within 5 percent of a given value or range. Numerical quantities given herein are approximate, meaning that the term "about", "approximate to", or "equal to" can be inferred if not expressly stated.

As used herein, the term "and/or" includes any and all combinations of one or more of the associated listed items.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

In some embodiments, implementations of partial circuits can be understood with reference to related circuits in a first reference of U.S. Pat. No. 10,763,875, a second reference of U.S. Pat. No. 10,778,242, and a third reference of U.S. Pat. No. 10,790,843, but the implementations of those circuits are not limited thereto.

In some embodiments, a coarse analog to digital conversion (hereinafter referred to as "coarse conversion" for simplicity) is an analog to digital conversion performed on a sampled input signal, and a fine analog to digital conversion (hereinafter referred to as "fine conversion" for simplicity) is an analog to digital conversion performed based on a result of a noise shaping, in which the noise shaping is performed based on residue(s) generated from previous analog to digital conversion(s). In some embodiments, the noise shaping may be utilized to feedback the residue signal (e.g., residue signal VRES1 and/or residue signal VRES2 as discussed below) to an input terminal of a quantizer circuit (e.g., the quantizer circuit 170 as discussed below). With the noise shaping, the frequency band characteristics of noises (especially, quantization noises) can be changed (i.e., shaped), such that the noise(s) will have lower power at the low frequency band. As a result, the required signal will have higher ratio of signal to noise at the low frequency band.

Figure 1:
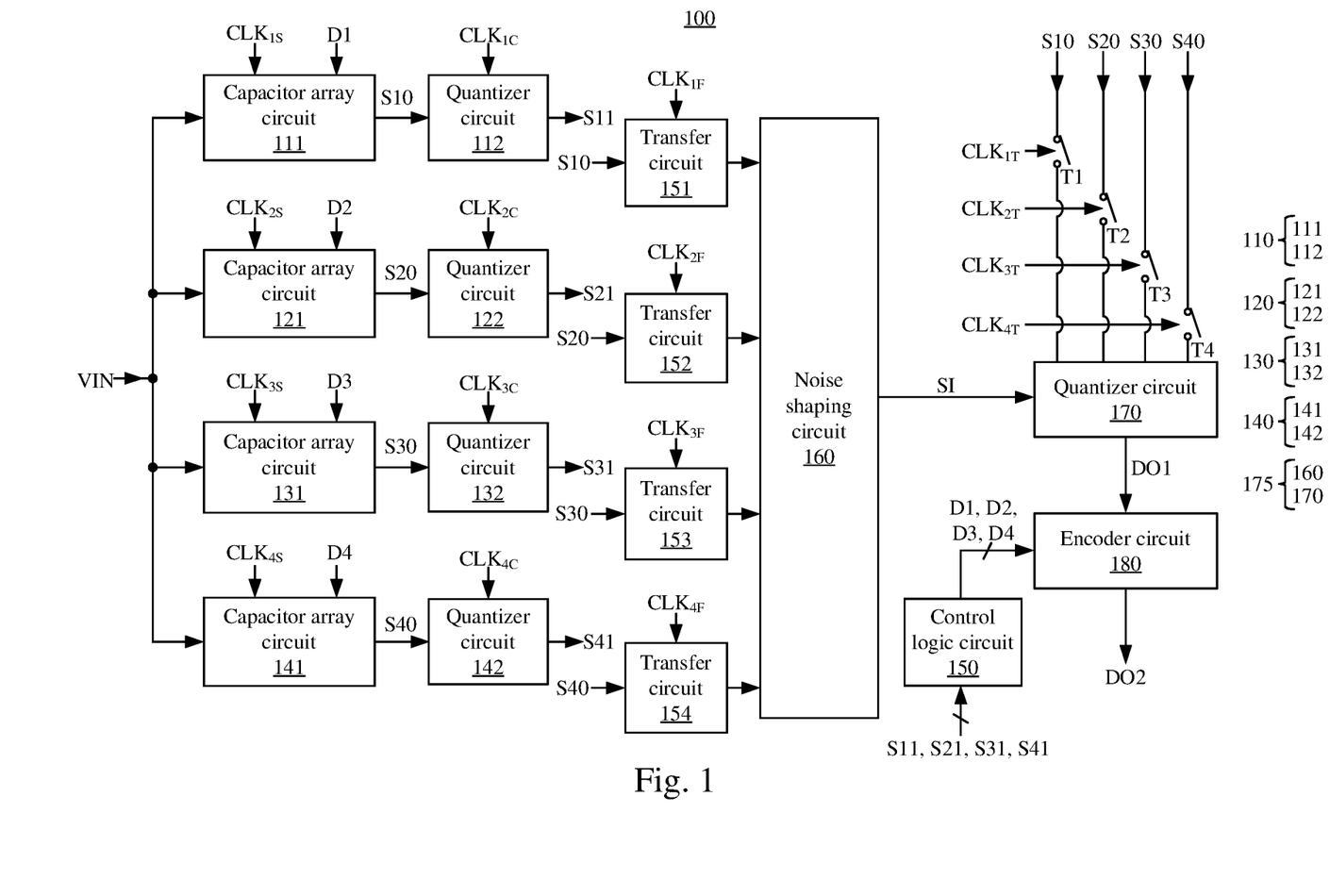
FIG. 1 illustrates a schematic diagram of a time-interleaved analog to digital converter according to some embodiments of the present disclosure.

FIG. 1 illustrates a schematic diagram of a time-interleaved analog to digital converter 100 according to some embodiments of the present disclosure. The time-interleaved analog to digital converter 100 includes coarse converter circuitries 110, 120, 130, and 140, a control logic circuit 150, transfer circuits T1-T4, transfer circuits 151-154, a fine converter circuitry 175, and an encoder circuit 180.

The coarse converter circuitries 110, 120, 130, and 140 sequentially sample an input signal VIN and perform coarse conversions, in order to generate decision signals S11, S21, S31, and S41. The control logic circuit 150 may generate coarse digital codes that respective correspond to the coarse conversions according to the decision signals S11, S21, S31, and S41. In some embodiments, the control logic circuit 150 may be implemented with logic circuits that perform a specific algorithm (which may be, but not limited to, a successive approximation resister algorithm, a binary search algorithm, and so on).

In greater detail, the coarse converter circuitry includes a capacitor array circuit 111 and a quantizer circuit 112. The capacitor array circuit 111 samples the input signal VIN according to the control signal $CLK_{1S}$, in order to generate a sampled signal S10. The quantizer circuit 112 is coupled to the capacitor array circuit 111 to receive the sampled signal S10, and is configured to perform a corresponding coarse conversion on the sampled signal S10 according to the control signal $CLK_{1C}$, in order to generate a corresponding decision signal S11. The control logic circuit 150 may perform the aforementioned specific algorithm according to the decision signal S11 to generate a corresponding coarse digital code. In some embodiments, the coarse conversion may be a successive approximation register analog to digital conversion, in which the control logic circuit 150 may switch the capacitor array circuit 111 based a result of the specific algorithm, in order to generate bits of the coarse digital code D1 step by step.

Similarly, the coarse converter circuitry 120 includes a capacitor array circuit 121 and a quantizer circuit 122. The coarse converter circuitry 130 includes a capacitor array circuit 131 and a quantizer circuit 132. The coarse converter circuitry 140 includes the capacitor array circuit 141 and a quantizer circuit 142. Corresponding relations among the capacitor array circuit 121, the control signal $CLK_{2S}$, and a sampled signal S20, those among the capacitor array circuit 131, a control signal $CLK_{3S}$, and a sampled signal S30, and those among the capacitor array circuit 141, a control signal $CLK_{4S}$, and a sampled signal S40 can be understood with reference to those among the capacitor array circuit 111, the control signal $CLK_{1S}$, and the sampled signal S10, and thus the repetitious descriptions are not further given. Corresponding relations among the quantizer circuit 122, the control signal $CLK_{2C}$, a decision signal S21, and a coarse digital code D2, those among the quantizer circuit 132, a control signal $CLK_{3C}$, a decision signal S31, and a coarse digital code D3, and those among the quantizer circuit 142, a control signal $CLK_{4C}$, a decision signal S41, and a coarse digital code D4 may be understood with reference to those among the quantizer circuit 112, the control signal $CLK_{1C}$, the decision signal S11, and the coarse digital code D1, and thus the repetitious descriptions are not further given.

In some embodiments, the implementation of each of the capacitor array circuits 111, 121, 131, and 141 may be understood with reference to that of the capacitor C1 in the first reference, or the capacitor array circuit CT in the second reference or the third reference, but the present disclosure is not limited thereto. In this example, each of the sampled signals S10, S20, S30, and S40 may be the signal on the node N1 in the first reference, the second reference, and/or the third reference, but the present disclosure is not limited thereto.

The transfer circuits T1-T4 are configured to sequentially transfer first residue signals from the coarse converter circuitries 110, 120, 130, and 140 according to control signals $CLK_{1T}$, $CLK_{2T}$, $CLK_{3T}$, and $CLK_{4T}$, in which the first residue signals are generated by the coarse converter circuitries 110, 120, 130, and 140 performing the coarse conversions sequentially. In greater detail, After a corresponding coarse converter circuitry in the coarse converter circuitries 110, 120, 130, and 140 performs a corresponding coarse conversion, each of the transfer circuits T1-T4 transfers the sampled signal from the capacitor array circuit in the corresponding coarse converter circuitry to be a corresponding first residue signal according to a corresponding one of the control signals $CLK_{1T}$, $CLK_{2T}$, $CLK_{3T}$, and $CLK_{4T}$. For example, after the coarse converter circuitry 110 performs the coarse conversion, the first residue signal is a signal on the capacitor array circuit 111. The transfer circuit T1 is turned on according to the control signal $CLK_{1T}$ after the coarse converter circuitry performs the coarse conversion, in order to transfer the sampled signal S10 from the capacitor array circuit 111 to be a corresponding first residue signal. With this analogy, it may understand the corresponding relations among the remaining first residue signals, the coarse converter circuitries 120, 130, and 140, and the transfer circuits T2-T4. In some embodiments, each of the transfer circuits T1-T4 may be implemented with a switching circuit, but the present disclosure is not limited thereto.

The fine converter circuitry 175 is configured to perform a fine conversion according to a first signal (hereinafter referred to as "residue signal VRES1", as labeled in FIGS.

3-6) of first residue signals (i.e., the sampled signals S10, S20, S30, and S40 after the coarse conversion is performed) and a second signal (hereinafter referred to as "residue signal VRES2", as labeled in FIGS. 3-6) in second residue signals, in order to generate a fine digital code DO1. For example, the fine converter circuitry 176 may perform the noise shaping according to the residue signal VRES2, and perform the analog to digital conversion according to the result of the noise shaping (e.g., a signal SI) and the residue signal VRES1 to generate the fine digital code DO1. In different embodiments, a sampling interval of each of the coarse converter circuitries 110, 120, 130, and 140 sampling the input signal VIN and a coarse conversion interval of each of the coarse converter circuitries 110, 120, 130, and 140 performing a coarse conversion are set based on a fine conversion interval of the fine converter circuitry 175 performing the fine conversion. The arrangements regarding herein will be provided with reference to FIGS. 3-6.

The transfer circuits 151-154 are configured to sequentially transfer the second residue signals from the coarse converter circuitries 110, 120, 130, and 140 according to control signals $CLK_{1F}$, $CLK_{2F}$, $CLK_{3F}$, and $CLK_{4F}$ to the fine converter circuitry 175. In some embodiments, the second residue signals are generated respectively by the coarse converter circuitries 110, 120, 130, and 140 in response to the fine conversion. For example, when a fine conversion that follows a corresponding one of the coarse analog to digital conversions is completed, each of the transfer circuits 151-154 may transfer the corresponding sampled signal from the capacitor array circuit in a corresponding coarse converter circuitry to be a corresponding one of the second residue signal according to a corresponding one of the control signals $CLK_{1F}$, $CLK_{2F}$, $CLK_{3F}$, and $CLK_{4F}$. For example, the fine converter circuitry 175 may perform the fine conversion according to the residue signal VRES1 from the coarse converter circuitry 110. After this fine conversion is completed, the sampled signal S10 on the capacitor array circuit 111 of the coarse converter circuitry 110 is the residue signal VRES2. The transfer circuit 151 may transfer the residue signal VRES2 (i.e., the sampled signal S10) according to the control signal $CLK_{1F}$ to the noise shaping circuit 160. Operations regarding herein will be provided with reference to FIG. 3.

In greater detail, the fine converter circuitry 175 includes a noise shaping circuit 160 and a quantizer circuit 170. The noise shaping circuit 160 is coupled to the transfer circuits 151-154 to sequentially receive the second residue signals, and perform the noise shaping according to the residue signal VRES2 to generate a signal SI (i.e., the result of the noise shaping). The quantizer circuit 170 may sequentially receive the first residue signals from the transfer circuit T1, and generate the fine digital code DO1 according to the residue signal VRES1 and the signal SI. In this embodiment, the quantizer circuit 170 may be a comparator circuit having more than two input terminals. For example, the comparator circuit may include two input pairs (which correspond to the input terminals), in which one input pair receive the residue signal VRES1, another one input pair receive the signal SI, and the comparator may generate the fine digital code DO1 according to the summation of the residue signal VRES1 and the signal SI. In some embodiments, the noise shaping circuit 160 may include an integrator circuit and a circuit portion for storing the residue signal VRES2. In some embodiments, the implementations of the transfer circuits 151-154 may be understood with reference to capacitors Cex5-Cex6 in FIG. 5A of the third reference, the implementations may be understood with reference to the circuit 120 (or 122) in FIG. 5A of the third reference, the implementations of the quantizer circuit 170 may be understood with reference to the circuit 140A (or 140B) in FIG. 5A of the third reference, but the present disclosure is not limited thereto.

The encoder circuit 180 is configured to generate a digital output DO2 according to a corresponding one of the coarse digital codes D1-D4 and the fine digital code DO1. For example, when the fine digital code DO1 is generated based on the first residue signal from the coarse converter circuitry 110 (i.e., when the residue signal VRES1 is from the capacitor array circuit 111), the encoder circuit 180 may combine the fine digital code DO1 and the coarse digital code D1 corresponding to the coarse converter circuitry 110 to generate the digital output DO2. Similarly, when the fine digital code DO1 is generated based on the first residue signal from the coarse converter circuitry 120 (i.e., when the residue signal VRES1 is from the capacitor array circuit 121), the encoder circuit 180 may combine the fine digital code DO1 and the coarse digital code D2 corresponding to the coarse converter circuitry 120 to generate the digital output DO2. With this analogy, the relations among the coarse digital codes D1-D4, the fine digital code DO1, and the digital output DO2 can be understood. In some embodiments, the encoder circuit 180 may be implemented with multiple digital logic circuits.

Figure 2:
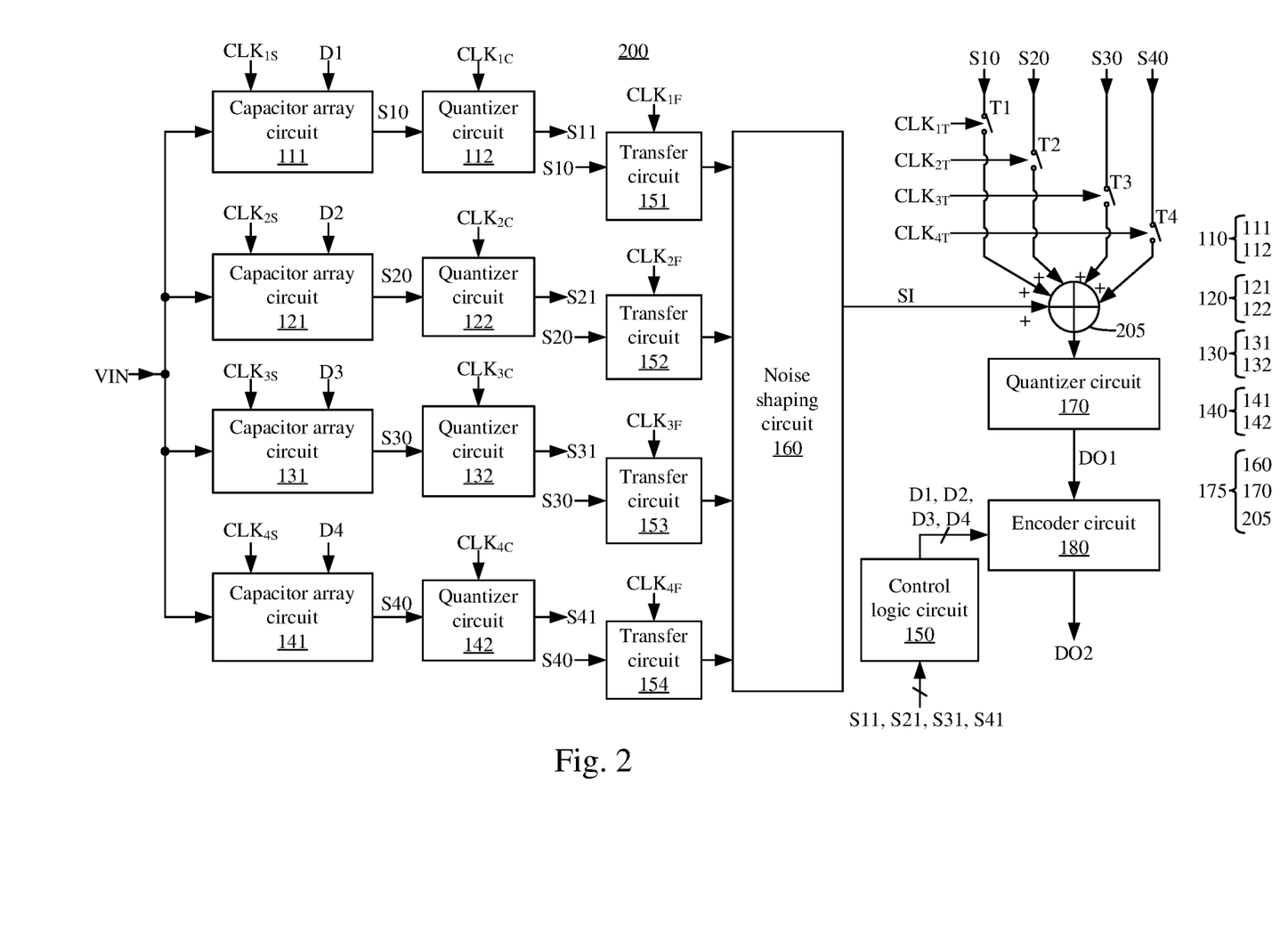
FIG. 2 illustrates a schematic diagram of a time-interleaved analog to digital converter according to some embodiments of the present disclosure.

FIG. 2 illustrates a schematic diagram of a time-interleaved analog to digital converter 200 according to some embodiments of the present disclosure. Compared with the time-interleaved analog to digital converter 100 in FIG. 1, in the time-interleaved analog to digital converter 200, the fine converter circuitry 175 further includes a summing circuit 205, which may be configured to sum up the residue signal VRES1 (i.e., a corresponding one of the sampled signals S10, S20, S30, and S40) and the signal SI. In this embodiment, the quantizer circuit 170 may be a comparator circuit having two input terminals, in which one input terminal may receive the summation of the residue signal VRES1 and the signal SI from the summing circuit 205, and another input terminal (not shown in the figure) may be configured to receive a common mode voltage (or a reference voltage). The quantizer circuit 170 may perform a quantization according to the summation of the residue signal VRES1 and the signal SI to generate the fine digital code DO1. In some embodiments, the summing circuit 205 may be implemented with a switched-capacitor circuit. For example, the implementations of the quantizer circuit 170 may be understood with reference to the comparator circuit 220 in the first reference, and the implementations of the summing circuit 205 may be understood with reference to the switching circuit 120 in the first reference, but the present disclosure is not limited thereto.

Figure 3:
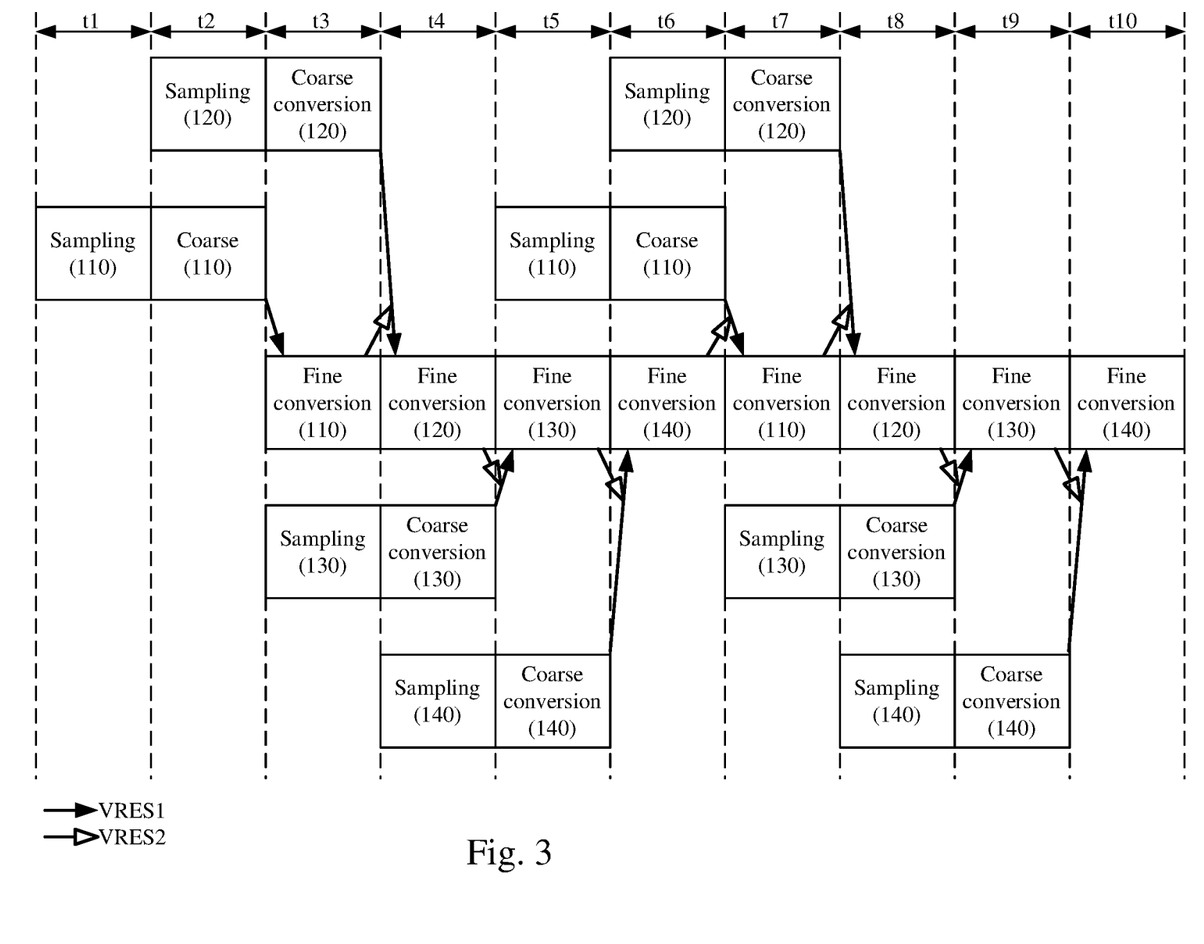
FIG. 3 illustrates a first operational timing scheme for the time-interleaved analog to digital converter in FIG. 1 or FIG. 2 according to some embodiments of the present disclosure.

FIG. 3 illustrates a first operational timing scheme for the time-interleaved analog to digital converter 100 in FIG. 1 (or the time-interleaved analog to digital converter 200 in FIG. 2) according to some embodiments of the present disclosure.

For ease of understanding, in FIGS. 3-6, the duration for a specific circuitry to perform a specific operation (e.g., coarse conversion or sampling) is expressed with "corresponding operation" and "number", in order to illustrate the timing sequence of the circuitries in the time-interleaved analog to digital converter 100 (or 200) cooperating with each other. For example, sampling (110) indicates a sampling interval of the coarse converter circuitry 110 sampling the input signal VIN, and coarse conversion (110) indicates a coarse conversion interval of the coarse converter circuitry 110 performing the coarse conversion. With this analogy, it is understood that sampling (120), sampling (130), and sampling (140) respectively indicate sampling intervals of the coarse converter circuitries 120, 130, and 140, and coarse conversion (120), coarse conversion (130), and coarse conversion (140) respectively indicate coarse conversion intervals of the coarse converter circuitries 120, 130, and 140. In addition, fine conversion (110) indicates a coarse conversion interval of the fine converter circuitry 175 performing the fine conversion in response to the residue signal VRES1 from the coarse converter circuitry 110. With this analogy, it is understood that a corresponding one of fine conversion (120), fine conversion(130), and fine conversion (140) indicates a fine conversion interval of the fine converter circuitry 175 performing the fine conversion in response to the residue signal VRES1 from a corresponding one of the coarse converter circuitries 120, 130, and 140. In this embodiment, each of the fine conversion interval, the coarse conversion interval, and the sampling interval has the same time length. In other words, in FIG. 3, each of intervals t1-t10 has the same time length.

In this embodiment, when a first coarse converter circuitry (e.g., the coarse converter circuitry 110) in the coarse converter circuitries 110, 120, 130, and 140 performs a first coarse conversion (i.e., coarse conversion during the interval t2) in the coarse conversions, a second coarse converter circuitry (e.g., the coarse converter circuitry 120) in the coarse converter circuitries 110, 120, 130, and 140 samples the input signal VIN. In other words, the coarse conversion interval of the first coarse converter circuitry (e.g., coarse conversion (110)) is overlapped with the sampling interval of the second coarse converter circuitry (e.g., sampling (120)).

In greater detail, during time interval t1, the control signal $CLK_{1S}$ has an enabling level. Under this condition, the coarse converter circuitry 110 may sample the input signal VIN to generate the sampled signal S10. During time interval t2, the control signal $CLK_{1C}$ has an enabling level. Under this condition, the coarse converter circuitry 110 may perform the coarse conversion according to the sampled signal S10 to generate the decision signal S11, and the control logic circuit 150 may generate the coarse digital code D1 according to the decision signal S11. In response to this coarse conversion, the capacitor array circuit 111 generates the residue signal VRES1 (i.e., the sampled signal S10 after the coarse conversion is performed). Moreover, during time interval t2, the control signal $CLK_{2S}$ has the enabling level. Under this condition, the coarse converter circuitry 120 may sample the input signal VIN to generate the sampled signal S20.

During time interval t3, the control signal $CLK_{1T}$ has an enabling level. Under this condition, the transfer circuit T1 may be turned on to transfer the residue signal VRES1 (i.e., the sampled signal S10) from the capacitor array circuit 111 in the coarse converter circuitry 110 to the fine converter circuitry 175. As the coarse converter circuitry 140 has not started operating during time interval t3, and thus the residue signal VRES2 at interval t3 is zero (and is thus not labeled). Therefore, during time interval t3, the fine converter circuitry 175 may perform the fine conversion according to the signal SI (which is a result of the noise shaping performed based on the residue signal VRES2 which is zero at interval t3) and the residue signal VRES1 to generate the fine digital code DO1. After the fine digital code DO1 is generated, the encoder circuit 180 may generate the digital output DO2 according to the coarse digital code D1 and the fine digital code DO1. In response to the fine conversion, the capacitor array circuit 111 generates the residue signal VRES2 (i.e., the sampled signal S10 after the fine conversion is performed). After the fine conversion is performed, the transfer circuit 151 may transfer the residue signal VRES2 (i.e., the sampled signal S10) to the noise shaping circuit 160 according to the control signal $CLK_{1F}$. Moreover, during time interval t3, the control signal $CLK_{2C}$ has the enabling level. Under this condition, the coarse converter circuitry 120 may perform the coarse conversion according to the sampled signal S20 to generate the decision signal S21, and the control logic circuit 150 may generate the coarse digital code D2 according to the decision signal S21. In response to the coarse conversion, the capacitor array circuit 121 generates the residue signal VRES1 (i.e., the sampled signal S20 after the coarse conversion is performed).

During time interval t4, the control signal $CLK_{2T}$ has the enabling level. Under this condition, the transfer circuit T2 may be turned on to transfer the residue signal VRES1 (i.e., the sampled signal S20) from the capacitor array circuit 121 in the coarse converter circuitry 120 to the fine converter circuitry 175. The fine converter circuitry 175 may perform the fine conversion according to the residue signal VRES1 from the coarse converter circuitry 120 and the signal SI (which is a result of the noise shaping performed based on the residue signal VRES2 from the coarse converter circuitry 110), in order to generate the fine digital code DO1. After the fine digital code DO1 is generated, the encoder circuit 180 may generate the digital output DO2 according to the coarse digital code D2 and the fine digital code DO1. In response to the fine conversion, the capacitor array circuit 121 generates the residue signal VRES2 (i.e., the sampled signal S20 after the fine conversion is performed). After the fine conversion is performed, the transfer circuit 152 may transfer the residue signal VRES2 (i.e., the sampled signal S20) to the noise shaping circuit 160 according to the control signal $CLK_{2F}$.

Similarly, during time interval t3, the control signal $CLK_{3S}$ has the enabling level. Under this condition, the coarse converter circuitry 130 may sample the input signal VIN to generate the sampled signal S30. During time interval t4, the control signal $CLK_{3C}$ has the enabling level. Under this condition, the coarse converter circuitry 130 may perform the coarse conversion according to the sampled signal S30, in order to generate the decision signal S31, and the control logic circuit 150 may generate the coarse digital code D3 according to the decision signal S31. In response to the coarse conversion, the capacitor array circuit 131 generates the residue signal VRES1 (i.e., the sampled signal S30 after the coarse conversion is performed). Moreover, during time interval t4, the control signal $CLK_{4S}$ has the enabling level. Under this condition, the coarse converter circuitry 140 may sample the input signal VIN to generate the sampled signal S40.

During time interval t5, the control signal $CLK_{3T}$ has the enabling level. Under this condition, the transfer circuit T3 may be turned on to transfer the residue signal VRES1 (i.e., the sampled signal S30) from the capacitor array circuit 131 in the coarse converter circuitry 130 to the fine converter circuitry 175. The fine converter circuitry 175 may perform the fine conversion according to the residue signal VRES1 from the coarse converter circuitry 130 and the signal SI (which is a result of the noise shaping performed based on the residue signal VRES2 from the coarse converter circuitry 120), in order to generate the fine digital code DO1. After the fine digital code DO1 is generated, the encoder circuit 180 may generate the digital output DO2 according to the coarse digital code D3 and the fine digital code DO1. In response to the fine conversion, the capacitor array circuit 131 generates the residue signal VRES2 (i.e., the sampled signal S30 after the fine conversion is performed). After the fine conversion is performed, the transfer circuit 153 may transfer the residue signal VRES2 (i.e., the sampled signal S30) to the noise shaping circuit 160 according to the control signal $CLK_{3F}$. Moreover, during time interval t5, the control signal $CLK_{4C}$ has the enabling level, and the control signal $CLK_{1S}$ has the enabling level. Under this condition, the coarse converter circuitry 140 may perform the coarse conversion according to the sampled signal S40 to generate the decision signal S41, and the control logic circuit 150 may generate the coarse digital code D4 according to the decision signal S41. In response to the coarse conversion, the capacitor array circuit 141 generates the residue signal VRES1 (i.e., the sampled signal S40 after the coarse conversion is performed). The coarse converter circuitry 110 may sample the input signal VIN to generate the sampled signal S10.

During time interval t6, the control signal $CLK_{4T}$ has the enabling level. Under this condition, the transfer circuit T4 may be turned on to transfer the residue signal VRES1 (i.e., the sampled signal S40) from the capacitor array circuit 141 in the coarse converter circuitry 140 to the fine converter circuitry 175. The fine converter circuitry 175 may generate the fine conversion according to the residue signal VRES1 from the coarse converter circuitry 140 and the signal SI (which is a result of the noise shaping performed based on the residue signal VRES2 from the coarse converter circuitry 130), in order to generate the fine digital code DO1. After the fine digital code DO1 is generated, the encoder circuit 180 may generate the digital output DO2 according to the coarse digital code D4 and the fine digital code DO1. In response to the fine conversion, the capacitor array circuit 141 generates the residue signal VRES2 (i.e., the sampled signal S40 after the fine conversion is performed). After the fine conversion is performed, the transfer circuit 154 may transfer the residue signal VRES2 (i.e., the sampled signal S40) to the noise shaping circuit 160 according to the control signal $CLK_{4F}$. Moreover, during time interval t6, the control signal $CLK_{1C}$ has the enabling level, and the control signal $CLK_{2S}$ has the enabling level. Under this condition, the coarse converter circuitry 110 may perform the coarse conversion according to the sampled signal S10 to generate the decision signal S11, and the control logic circuit 150 may generate the coarse digital code D1 according to the decision signal S11. In response to the coarse conversion, the capacitor array circuit 111 generates the residue signal VRES1 (i.e., the sampled signal S10 after the coarse conversion is performed). The coarse converter circuitry 120 may sample the input signal VIN to generate the sampled signal S20.

With this analogy, during time interval t7, the control signal $CLK_{1T}$ has the enabling level. Under this condition, the transfer circuit T1 may be turned on to transfer the residue signal VRES1 (i.e., the sampled signal S10) from the capacitor array circuit 111 in the coarse converter circuitry 110 to the fine converter circuitry 175. The fine converter circuitry 175 may perform the fine conversion according to the residue signal VRES1 from the coarse converter circuitry 110 and the signal SI (which is a result of the noise shaping performed based on the residue signal VRES2 from the coarse converter circuitry 140), in order to generate the fine digital code DO1. Remaining operations during time intervals t7-t10 can be understood with reference to those during time intervals t1-t6, and thus the repetitious descriptions are not further given.

Figure 4:
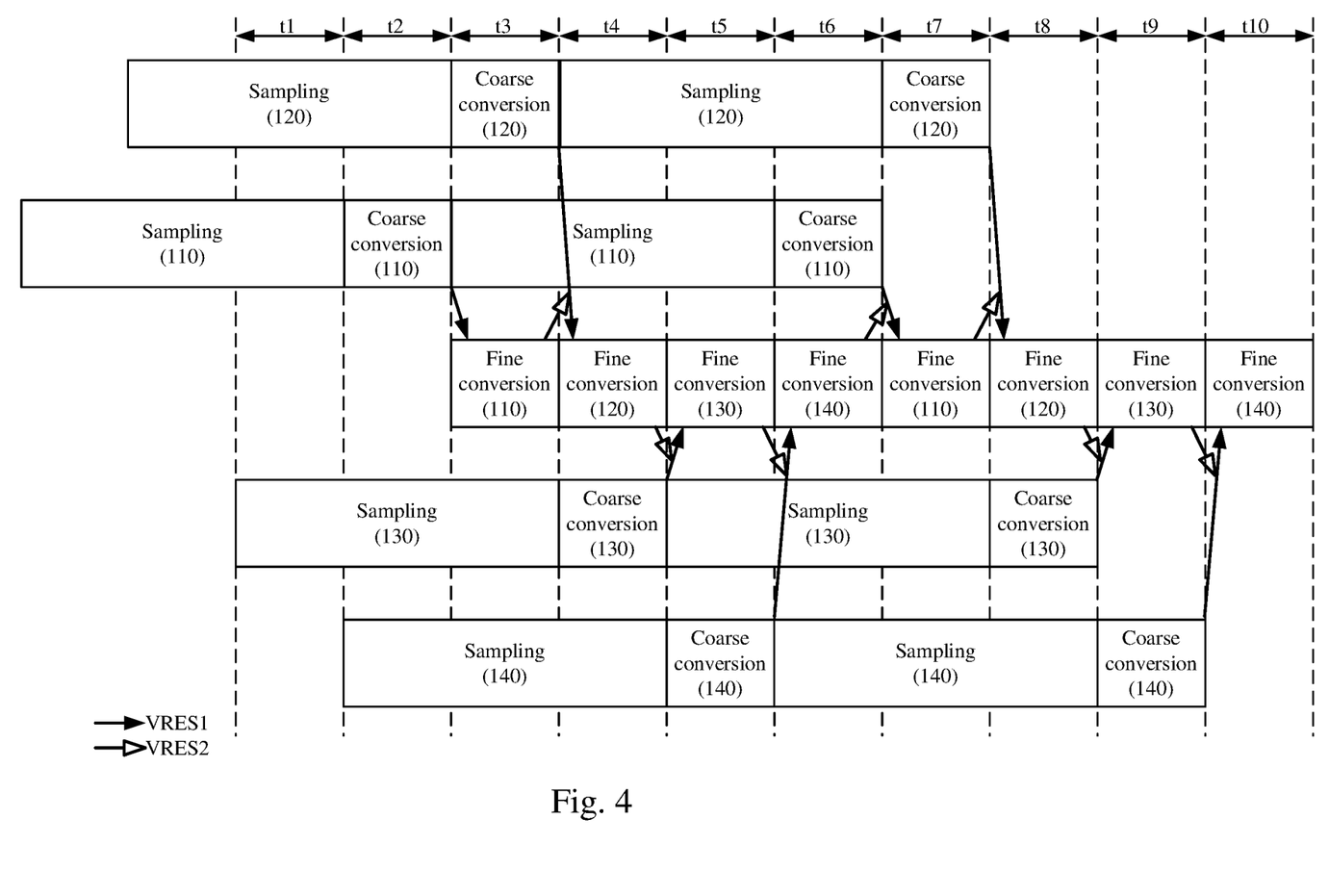
FIG. 4 illustrates a second operational timing scheme for the time-interleaved analog to digital converter in FIG. 1 or FIG. 2 according to some embodiments of the present disclosure.

FIG. 4 illustrates a second operational timing scheme for the time-interleaved analog to digital converter 100 in FIG. 1 (or the time-interleaved analog to digital converter 200 in FIG. 2) according to some embodiments of the present disclosure. Compared with FIG. 3, in this embodiment, when a first coarse converter circuitry (e.g., the coarse converter circuitry 110) in the coarse converter circuitries 110, 120, 130, and 140 performs a first coarse conversion in the coarse conversions, a second coarse converter circuitry (e.g., the coarse converter circuitry 120) in the coarse converter circuitries 110, 120, 130, and 140 samples the input signal VIN, and the sampling interval of the second coarse converter circuitry is overlapped with the coarse conversion interval of the first coarse converter circuitry performing the first coarse conversion and the sampling interval of the first coarse converter circuitry. For example, the sampling interval of the coarse converter circuitry 120 (labeled as sampling (120)) is overlapped with the coarse conversion interval (labeled as coarse conversion (110)) and the sampling interval (labeled as sampling (110)) of the coarse converter circuitry 110. Relevant operations in each interval are similar to those in FIG. 3, and thus the repetitious descriptions are not further given.

As shown in FIG. 4, the sampling interval is longer than the coarse conversion interval, and is longer than the fine conversion interval. For example, the coarse conversion interval and the fine conversion interval have the same time length, and the time length of the sampling interval is equal to three times the time length of the fine conversion interval (assumed that each time interval t1-t10 has the same time length). For example, during time intervals t4-t6, the time length of the sampling interval of the coarse converter circuitry 120 (i.e., sampling (120)) is equal to that of the total intervals of the fine converter circuitry 175 performing three fine conversions (i.e., fine conversion (120), fine conversion (130), and fine conversion (140)) in sequential response to the residue signal VRES1 from the coarse converter circuitries 120, 130, and 140. With the above arrangements, the capacitor array circuits 111, 121, 131, and 141 may have more time to sample the input signal VIN. As a result, the hardware requirements of the capacitor array circuits 111, 121, 131, and 141 can be lower, in order to save the circuit cost and/or lower the overall power consumption.

Figure 5:
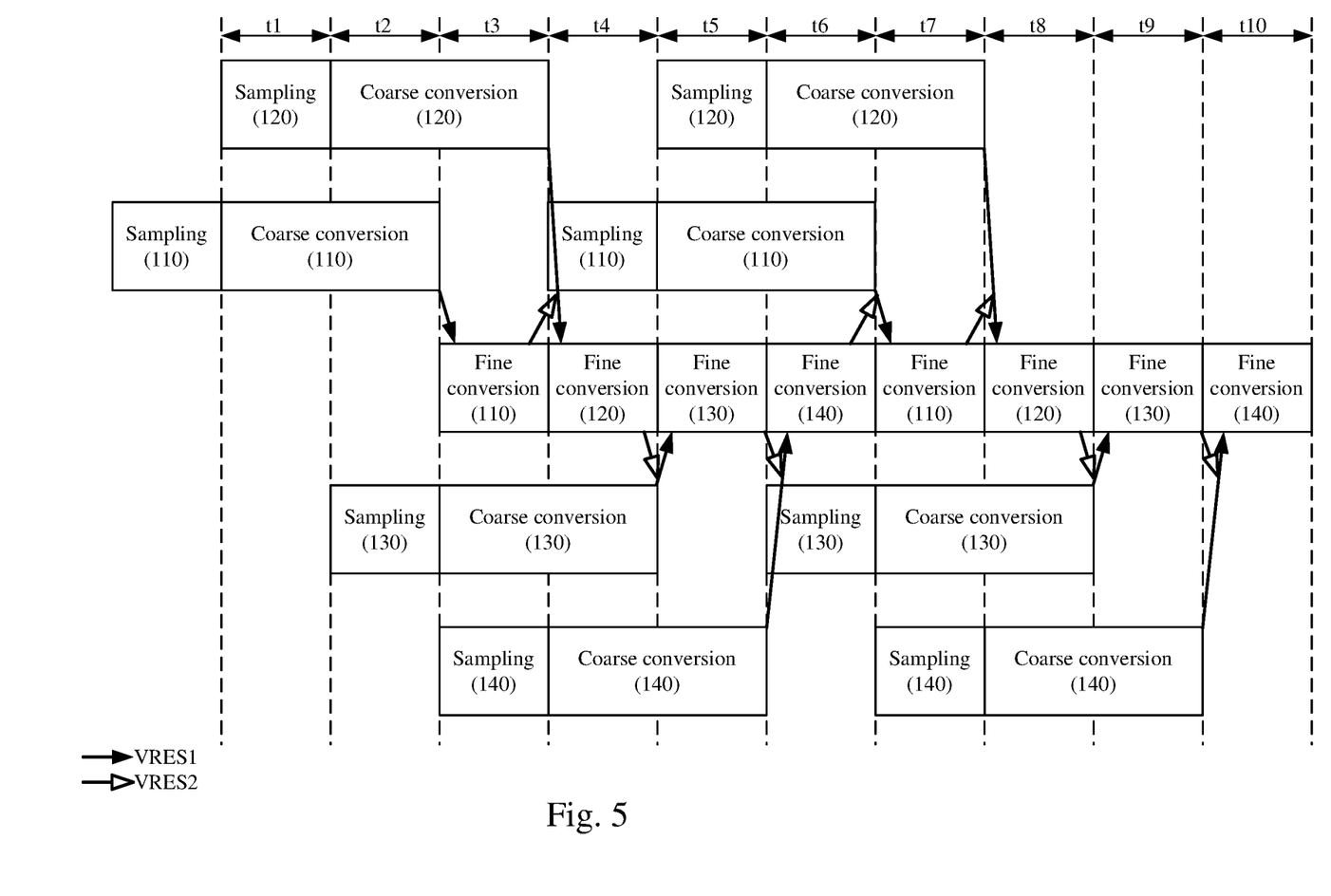
FIG. 5 illustrates a third operational timing scheme for the time-interleaved analog to digital converter in FIG. 1 or FIG. 2 according to some embodiments of the present disclosure.

FIG. 5 illustrates a third operational timing scheme for the time-interleaved analog to digital converter 100 in FIG. 1 (or the time-interleaved analog to digital converter 200 in FIG. 2) according to some embodiments of the present disclosure. In this embodiment, when a first coarse converter circuitry (e.g., the coarse converter circuitry 110) in the coarse converter circuitries 110, 120, 130, and 140 performs a first coarse conversion in the coarse conversions, a second coarse converter circuitry (e.g., the coarse converter circuitry 120) in the coarse converter circuitries 110, 120, 130, and 140 samples the input signal VIN, and the coarse conversion interval for performing the first coarse conversion is overlapped with the sampling interval and the coarse conversion interval of the second coarse converter circuitry. For example, the coarse conversion interval of the coarse converter circuitry 110 (labeled as coarse conversion (110)) is overlapped with the sampling interval of the coarse converter circuitry 120 (labeled as sampling (120)) and the coarse conversion interval of the coarse converter circuitry 120 (labeled as coarse conversion (120) which is partially overlapped with coarse conversion (110)). Relevant operations in each interval are similar to those in FIG. 3, and thus the repetitious descriptions are not further given.

Moreover, as shown in FIG. 5, a starting time of the sampling interval of the second coarse converter circuitry is equal to a starting time of the coarse conversion interval of the coarse converter circuitry, the coarse conversion interval is longer than the sampling interval, and the time length of the sampling interval is equal to that of the fine conversion interval. For example, the stating of the sampling interval of the coarse converter circuitry 120 (labeled as sampling (120)) is equal to the starting time of the coarse conversion interval of the coarse converter circuitry 110 (labeled as coarse conversion interval (110)), and the time length of the coarse conversion interval is equal to twice the time length of the sampling interval. For example, during time intervals T6-T7, the time length of the coarse conversion interval of the coarse converter circuitry 120 performing the coarse conversion (labeled as coarse conversion (120)) is equal to that of the total interval of the fine converter circuitry 175 performing two fine conversions (i.e., fine conversion (140) and fine conversion (110)) in sequentially response to the residue signal VRES1 from the coarse converter circuitries 140 and 110. With the above arrangements, the quantizer circuits 112, 122, 132, and 142, the control logic circuit 150 and/or the transfer circuits T1-T4 may have more time to generate the coarse digital codes D1-D4 and/or transfer the residue signal VRES1. As a result, it can lower the hardware requirements of those circuits, in order to save circuit cost and/or lower overall power consumption.

Figure 6:
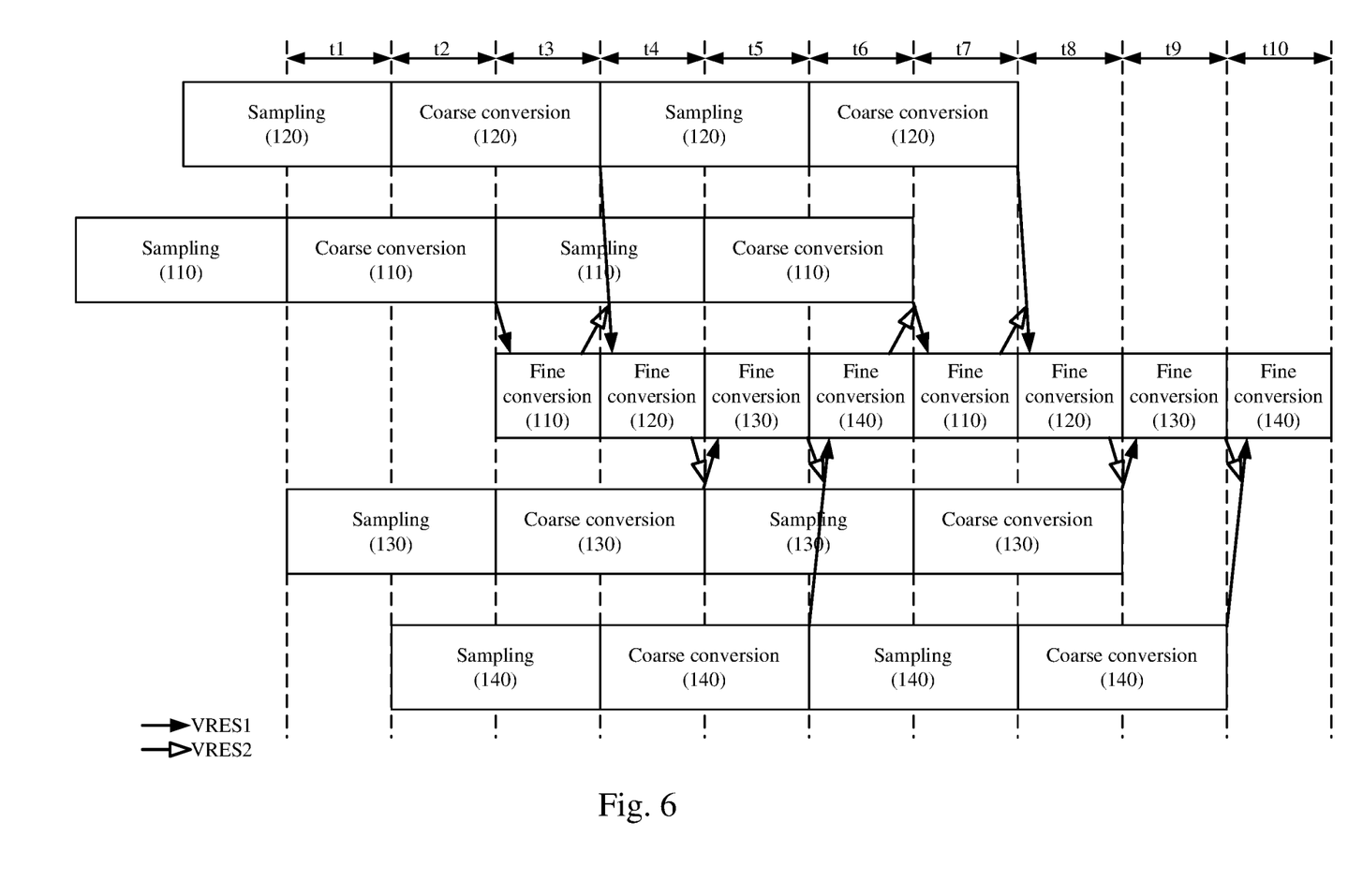
FIG. 6 illustrates a fourth operational timing scheme for the time-interleaved analog to digital converter in FIG. 1 or FIG. 2 according to some embodiments of the present disclosure.

FIG. 6 illustrates a fourth operational timing scheme for the time-interleaved analog to digital converter 100 in FIG. 1 (or the time-interleaved analog to digital converter 200 in FIG. 2) according to some embodiments of the present disclosure. Different from FIG. 5, in this embodiment, the starting time of the sampling interval of the second coarse converter circuitry is earlier than the starting time of the coarse conversion interval of the first coarse converter circuitry. For example, the starting time of the sampling interval of the coarse converter circuitry 120 (labeled as sampling (120)) is earlier than the starting time of the coarse conversion interval of the coarse converter circuitry 110 (labeled as coarse conversion interval (110)). A sampling interval of a third coarse converter circuitry (e.g., the coarse converter circuitry 130) in the coarse converter circuitries 110, 120, 130, and 140 (labeled as sampling (130)) is overlapped with the coarse conversion interval of performing the first coarse conversion (labeled as coarse conversion interval (110)), a coarse conversion interval of a fourth coarse converter circuitry (e.g., the coarse converter circuitry 140) in the coarse converter circuitries 110, 120, 130, and 140 (labeled as coarse conversion (130)) is overlapped with the sampling interval of the second coarse converter circuitry (labeled as sampling (120)), and the time length of the sampling interval is equal to that of the coarse conversion interval.

Furthermore, the time length of the sampling interval is equal to twice the time length of the fine conversion. For example, during time intervals t4-t6, the time length of the sampling interval of the coarse converter circuitry 120 (i.e., sampling (120)) is equal to that of a total interval of the fine converter circuitry 175 performing two fine conversions (i.e., fine conversion (120) and fine conversion (130)) in sequential response to the residue signal VRES1 from the coarse converter circuitries 120 and 130. With such arrangements, the capacitor array circuits 111, 121, 131, and 141, the quantizer circuits 112, 122, 132, and 142, the control logic circuit 150, and/or the transfer circuits T1-T4 may have more time to generate the coarse digital codes D1-D4 and/or transfer the residue signal VRES1. As a result, it can lower the hardware requirements of those circuits, in order to save the circuit cost and/or lower overall power consumption.

In above embodiments, the number of coarse converter circuitries in FIG. 1 or FIG. 2 (i.e., the coarse converter circuitries 110, 120, 130, and 140) is four, but the present disclosure is not limited thereto. Based on FIGS. 3-6, it is understood that, the operating speed of the time-interleaved analog to digital converter 100 (or the time-interleaved analog to digital converter 200 in FIG. 2) in some embodiments are mainly determined by the fine conversion interval, and the sampling interval and/or the coarse conversion interval may be adjusted based on the fine conversion interval and practical circuit requirements. Various operational timings shown in FIGS. 3-6 are given for illustrative purposes, and the present disclosure is not limited thereto. In different embodiments, according to practical requirements, the time length of the sampling interval or the coarse conversion interval may be shorter than the time length of the fine conversion interval.

In FIGS. 3-6, according to different applications, the interval of the noise shaping circuit 160 performing the noise shaping may be earlier than or overlapped with the fine conversion interval. For example, in some applications, a non-overlapping interval is present between the coarse conversion interval and the fine conversion interval, and the noise shaping circuit 160 may perform the noise shaping during that non-overlapping interval (which is earlier than the fine conversion interval), in order to generate the signal SI before the fine conversion interval. Alternatively, in some other examples, the noise shaping circuit 160 may perform the noise shaping and generate the signal SI during the fine conversion interval. The arrangements about the interval for performing the noise shaping are given for illustrative purposes, and the present disclosure is not limited thereto.

As described above, the time-interleaved analog to digital converter in some embodiments of the present disclosure may utilize multiple operational timings to perform coarse conversion(s) and fine conversion(s) including noise shaping. As a result, the signal to noise ratio in high speed applications can be improved and the requirements of some circuits can be lower.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A time-interleaved analog to digital converter, comprising:
   a plurality of coarse converter circuitries configured to sequentially sample an input signal and perform a plurality of coarse analog to digital conversions, in order to generate a plurality of decision signals;
   a control logic circuit configured to generate a plurality of coarse digital code respectively corresponding to the plurality of coarse analog to digital conversions according to the plurality of decision signals;
   a plurality of first transfer circuits configured to sequentially transfer a plurality of first residue signals from the plurality of coarse converter circuitries according to a plurality of first control signals, wherein the plurality of first residue signals are generated by the plurality of coarse converter circuitries sequentially performing the plurality of coarse analog to digital conversions;
   a fine converter circuitry configured to perform a fine analog to digital conversion according to a first signal in the plurality of first residue signal and a second signal in a plurality of second residue signals to generate a fine digital code, wherein a sampling interval of each of the plurality of coarse converter circuitries sampling the input signal and a coarse conversion interval of each of the plurality of coarse converter circuitries performing each of the plurality of coarse analog to digital conversions are set based on a fine conversion interval of the fine converter circuitry performing the fine analog to digital conversion;
   a plurality of second transfer circuits configured to sequentially transfer the plurality of second residue signals to the fine converter circuitry according to a plurality of second control signals, wherein the plurality of second residue signals are generated by the plurality of coarse converter circuitries in response to the fine analog to digital conversion; and
   an encoder circuit configured to generate a digital output according to a corresponding one of the plurality of coarse digital codes and the fine digital code.

2. The time-interleaved analog to digital converter of claim 1, wherein when the plurality of coarse converter circuitries sample the input signal or perform the plurality of coarse analog to digital conversions, the fine converter circuitry performs the fine analog to digital conversion, the fine analog to digital conversion is an analog to digital conversion performed based on a result of a noise shaping and the first signal, and the noise shaping is performed according to the second signal.

3. The time-interleaved analog to digital converter of claim 1, wherein a number of the plurality of coarse converter circuitries is four.

4. The time-interleaved analog to digital converter of claim 1, wherein the second signal is generated by a first coarse converter circuitry in the plurality of coarse converter circuitries in response to the fine analog to digital conversion, the first signal is generated based on a corresponding one of the plurality of coarse analog to digital conversions that is performed by a second coarse converter circuitry in the plurality of coarse converter circuitries, and a starting time of the sampling interval of the first coarse converter circuitry is earlier than a starting time of the sampling interval of the second coarse converter circuitry.

5. The time-interleaved analog to digital converter of claim 1, wherein when a first coarse converter circuitry in the plurality of coarse converter circuitries performs a first coarse analog to digital conversion in the plurality of coarse analog to digital conversions, a second coarse converter circuitry in the plurality of coarse converter circuitries samples the input signal, and each of the fine conversion interval, the coarse conversion interval, and the sampling interval has the same time length.

6. The time-interleaved analog to digital converter of claim 1, wherein when a first coarse converter circuitry in the plurality of coarse converter circuitries performs a first coarse analog to digital conversion in the plurality of coarse analog to digital conversions, a second coarse converter circuitry in the plurality of coarse converter circuitries samples the input signal, and the sampling interval of the second coarse converter circuitry is overlapped with the coarse conversion interval and the sampling interval of the first coarse converter circuitry.

7. The time-interleaved analog to digital converter of claim 6, wherein the sampling interval is longer than the coarse conversion interval, and is longer than the fine conversion interval.

8. The time-interleaved analog to digital converter of claim 6, wherein a time length of the sampling interval is equal to three times a time length of the fine conversion interval.

9. The time-interleaved analog to digital converter of claim 1, wherein when a first coarse converter circuitry in the plurality of coarse converter circuitries performs a first coarse analog to digital conversion in the plurality of coarse analog to digital conversions, a second coarse converter circuitry in the plurality of coarse converter circuitries samples the input signal, and the coarse conversion interval of performing the first coarse analog to digital conversion is overlapped with the sampling interval and the coarse conversion interval of the second coarse converter circuitry.

10. The time-interleaved analog to digital converter of claim 9, wherein a starting time of the sampling interval of the second coarse converter circuitry is earlier than or equal to a starting time of the coarse conversion interval of the first coarse converter circuitry.

11. The time-interleaved analog to digital converter of claim 10, wherein when the starting time of the sampling interval of the second coarse converter circuitry is equal to the starting time of the coarse conversion interval of the first coarse converter circuitry, the coarse conversion interval is longer than the sampling interval.

12. The time-interleaved analog to digital converter of claim 9, wherein the plurality of coarse converter circuitries further comprises a third coarse converter circuitry and a fourth coarse converter circuitry, the sampling interval of the third coarse converter circuitry is overlapped with the coarse conversion interval of performing the first coarse analog to digital conversion, and the coarse conversion interval of the fourth coarse converter circuitry is overlapped with the sampling interval of the second coarse converter circuitry.

13. The time-interleaved analog to digital converter of claim 9, wherein a time length of the sampling interval is equal to twice a time length of the fine conversion interval.

14. The time-interleaved analog to digital converter of claim 9, wherein when a starting time of the sampling interval of the second coarse converter circuitry is equal to a starting time of the coarse conversion interval of the first coarse converter circuitry, a time length of the sampling interval is equal to a time length of the fine conversion interval.

15. The time-interleaved analog to digital converter of claim 9, wherein when a starting time of the sampling interval of the second coarse converter circuitry is earlier than a starting time of the coarse conversion interval of the first coarse converter circuitry, a time length of the sampling interval is equal to twice a time length of the fine conversion interval.

16. The time-interleaved analog to digital converter of claim 1, wherein each of the plurality of coarse converter circuitries comprises:
   a capacitor array circuit configured to sample the input signal according to a third control signal, in order to generate a sample signal; and
   a quantizer circuit configured to perform a corresponding one of the plurality of coarse analog to digital conversions on the sampled signal according to a fourth control signal, in order to generate a corresponding one of the plurality of decision signals.

17. The time-interleaved analog to digital converter of claim 16, wherein after a corresponding coarse converter circuitry in the plurality of coarse converter circuitries performs a corresponding coarse analog to digital conversion in the plurality of coarse analog to digital conversions, each of the plurality of first transfer circuits is configured to transfer the sampled signal from the capacitor array circuit in the corresponding coarse converter circuitry to be a corresponding one of the plurality of first residue signals according to a corresponding one of the plurality of first control signals.

18. The time-interleaved analog to digital converter of claim 17, wherein after the fine analog to digital conversion that follows the corresponding coarse analog to digital conversion is performed, each of the plurality of second transfer circuits is configured to transfer the sampled signal from the capacitor array circuit in the corresponding coarse converter circuitry to be a corresponding one of the plurality of second residue signals according to a corresponding one of the plurality of second control signals.

19. The time-interleaved analog to digital converter of claim 1, wherein the fine conversion circuitry comprises:
   a noise shaping circuit configured to perform a noise shaping according to the second signal to generate a third signal; and
   a quantizer circuit configured to generate the fine digital code according to the third signal and the first signal.

20. The time-interleaved analog to digital converter of claim 19, wherein the fine conversion circuitry further comprises:
   a summing circuit configured to sum up the first signal and the third signal,
   wherein the quantizer circuit is configured to generate the fine digital code according to a summation of the first signal and the third signal.

* * * * *